United States Patent

Assour

[15] 3,696,272

[45] Oct. 3, 1972

[54] AVALANCHE DIODE

[72] Inventor: Jacques Mayer Assour, Princeton, N.J.

[73] Assignee: RCA Corporation

[22] Filed: Aug. 21, 1970

[21] Appl. No.: 65,948

[52] U.S. Cl. ..................................317/234, 317/235

[51] Int. Cl. ..................................................H01l 5/00

[58] Field of Search.......................................317/234

[56] References Cited

UNITED STATES PATENTS 3,381,255 4/1968 Youmans...................338/308

OTHER PUBLICATIONS

Proceedings of the IEEE, November 1968, pages 2,054– 2,055.

*Primary Examiner*—James D. Kallam

*Attorney*—Glenn H. Bruestle

[57] ABSTRACT

An avalanche diode which will oscillate to generate microwave powers in the frequency range of 2 to 16 gigahertz with efficiencies of up to at least 30 percent. The diode will also function as a microwave amplifier in the same frequency range. The diode includes a body of semiconductor material having two spaced apart regions and a third region between and contiguous to both of the other regions. The outer two regions are of low resistivity and of opposite conductivity type. The third intermediate region is of a conductivity type the same as one of the outer regions and forms an abrupt or hyperabrupt PN junction with the other of the outer regions. The third region is of a thickness of between 0.5 and 3 microns and a resistivity of between 0.5 and 10 ohm-cm.

5 Claims, 1 Drawing Figure

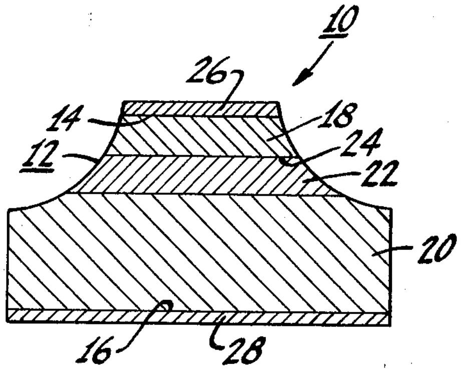
INVENTOR.
JACQUES M. ASSOUR
BY
Donald S. Cohen
Attorney

AVALANCHE DIODE

BACKGROUND OF THE INVENTION

The invention herein disclosed was made in the course of or under a contract or subcontract thereunder with the Department of the Air Force.

The present invention relates to an avalanche diode, and more particularly to an avalanche diode which will oscillate to efficiently generate microwave power and which will amplify in the frequency range of 2 to 16 gigahertz.

One of the greatest advances in the electronics field over the past years has been the development of solid state semiconductor device as a replacement for vacuum tubes for generating and amplifying electrical power. However, only recently has there been developed solid state semiconductor devices for efficiently generating microwave energy. One semiconductor device which has been developed for generated microwave energy is the avalanche diode. However, the avalanche diodes that were initially developed for microwave operation had certain disadvantages in that they had a limited frequency range of operation, relatively low power output and low operating efficiency.

SUMMARY OF THE INVENTION

An avalanche diode includes a body of semiconductor material having two contiguous regions of opposite conductivity type forming a P-N junction therebetween. One of the regions is of low resistance and the other region is of high resistance. The high resistance region has a resistance of between 0.5 and 15 ohm-cm and is of a thickness of between 0.5 and 3 microns.

BRIEF DESCRIPTION OF DRAWING

The FIGURE of the drawing is a sectional view of a form of the avalanche diode of the present invention.

DETAILED DESCRIPTION

Referring to the drawing, a form of the avalanche diode of the present invention is generally designated as 10. The diode 10 comprises body 12 of a semiconductor material, such as silicon, having spaced, parallel surfaces 14 and 16. The body 12 includes a pair of spaced regions 18 and 20 which are at and extend across the surfaces 14 and 16 respectively of the body 12 and a third region 22 between and contiguous with both of the other regions 18 and 20. The outer regions 18 and 20 are of low resistivity, less than 0.01 ohm-cm, and are of mutually opposite conductivity types. The intermediate third region 22 is the most active region of the diode 10 and is of the same conductivity type as the outer region 20 but of higher resistivity, between 0.5 to 15 ohm-cm. Thus, the outer region 18 can be of P+ type conductivity, the third region 22 of N type conductivity and the outer region 20 of N+ type conductivity for a P+NN+ diode 10. Alternatively, the outer region 18 can be of N+ type conductivity, the third region 22 of P type conductivity and the outer region 20 of P+ type conductivity for an N+PP+ diode 10. For either type of the diode 10 a PN junction 24 is provided between the third region 22 and the outer region 18. For maximum efficiency of operation of the diode 10, the impurity profile of the third region 22 should be designed to provide either an abrupt or hyperabrupt PN junction 24. For an abrupt junction the level of impurity in the third region 22 is a constant value throughout the thickness of the third region 22. For a hyperabrupt junction, the level of impurity in the third region 22 decreases with distance away from the junction. For both the abrupt and the hyperabrupt junctions there is an abrupt change of the dopant concentration from that of the low resistivity region 18 to that of the high resistivity region 22 over a very small distance across the junction 24.

The outer region 18 should be relatively thin, 1 to 5 microns in thickness, so as to provide for good heat dissipation from the PN junction 24. The thinner the outer region 18 the more efficient the heat is dissipated. The outer region 20 can be relatively thick, 25 to 50 microns in thickness, since it merely provides an electrical contact to and mechanical support for the active third region 22. For microwave operation, the active third region 22 is of a thickness of between 0.5 and 3 microns. The specific thickness of the third region 22 depends on the desired frequency of operation of the diode 10. Table I shows the frequency of operation of the diode 10 for various thickness of the active third region 22.

TABLE I

| Frequency (GHz) | Thickness of Active Region (microns) |
|---|---|
| 8 to 16 | 1 to 0.5 |
| 4 to 8 | 2 to 1 |
| 2 to 4 | 3 to 2 |

As can be seen from Table I, the avalanche diode 10 can be made so as to operate over a range of 2 to 16 GHz depending on the thickness of the active third region 22. The avalanche diode 10 will operate at high power levels such as at least 100 $KW/cm^2$, and at efficiencies of up to at least 30 percent. The avalanche diodes 10 having an abrupt junction profile can be used primarily as efficient oscillators for generating microwave power. The avalanche diodes 10 having hyperabrupt junction profiles can be used both as efficient oscillators and as amplifiers. Since the impurity distribution of the hyperabrupt junction profile varies very fast, the dynamic capacitance also changes fast thus leading to wide dynamic range of amplification.

One method of making the avalanche diode 10 is to sequentially epitaxially grow on a substrate of the semiconductor material, which forms the outer layer 20, two layers of the semiconductor material, which form the third layer 22 and the outer layer 18. For this method one starts with a substrate wafer of a low resistivity, 0.01 ohm-cm, semiconductor material, such as silicon of the desired conductivity type, either N+ or P+ type conductivity. The wafer may be of any desired diameter and is preferably thicker than the desired thickness of the outer region 20. For example, the wafer may be of a diameter between 25 and 50 millimeters and a thickness of 0.15 millimeters. The wafer is mechanically and chemically polished on both surfaces and checked for chemical and crystallographic defects. It is desirable that the wafer be as defect free as possible, preferable a defect density less than 1,000 per $cm^2$. A layer of clean silicon dioxide, about 1 micron thick, is grown on one surface of the wafer to mask the surface against contaminates diffusing into the surface. The silicon dioxide layer can be coated on the wafer by exposing the surface of the wafer to an atmosphere of a gaseous mixture of silane and either oxygen or water vapor which mixture is heated to a temperature of 1050° C. to react the gaseous mixture and deposit silicon dioxide on the exposed surface of the wafer.

The wafer is then placed in a reactor chamber with its other surface exposed and heated to a temperature of 1100° C. The third region 22 is then formed by depositing on the surface of the wafer a layer of silicon of the desired conductivity type. This is achieved by introducing into the chamber a gaseous mixture of silane and a material containing a conductivity modifier impurity. If the third region 22 is to be of N type conductivity, the material containing the conductivity modifier impurity may be either gaseous phosphine or gaseous arsine. If the third region is to be of P type conductivity, the material containing the conductivity modifier impurity may be gaseous diborane. The heat from the wafer causes the gaseous mixture to react to deposit on the exposed surface of the wafer a layer of silicon containing the desired conductivity modifier impurity, either phosphorus or arsenic for N type conductivity or boron for P type conductivity. This deposition is carried out for a period of time to achieve a deposited layer of the desired thickness for the third region 22. Also, if the diode 10 is to have a hyperabrupt junction, the ratio of the amount of the material containing the conductivity modifier impurity into the amount of silane in the mixture can be varied during the deposition process to achieve the desired impurity profile.

After the layer forming the third region 22 is deposited, the outer region 18 is similarly formed by depositing on the third region layer a layer of silicon of the desired conductivity type. The outer region layer is deposited by introducing into the chamber a gaseous mixture of silane and a material containing the desired conductivity modifier impurity, either phosphine or arsine for N type conductivity or diborane for P type conductivity. However, this gaseous mixture includes a larger amount of the material containing conductivity modifier impurity so as to deposit a layer having the desired low resistivity. After the outer region layer of the desired thickness is deposited, the wafer is cooled and removed from the reactor chamber.

The substrate wafer is then reduced in thickness to the desired thickness of the outer region 20 by lapping the surface of the substrate wafer which was coated with the silicon dioxide layer. Metal contacts 26 and 28 can then be coated on the surfaces of the outer regions 18 and 20. The metal contacts 26 and 28 can be of any electrically conductive metal or metals which will provide good ohmic contacts to the outer regions. For example, the contacts 26 and 28 may be a layer of titanium on the surface of each of the outer regions, a layer of palladium on the titanium layer and a layer of gold on the palladium layer, or the contacts 26 and 28 may be a layer of chromium on the surfaces of the outer regions and a layer of gold over the chromium layer. The metal contacts 26 and 28 can be coated on the outer regions by the well known technique of vacuum evaporation. The wafer is then diced into the individual diodes of the desired size generally of a diameter of 0.025 to 1.125 millimeters at the PN junction 24. If the diodes are to be of a mesa structure, such as shown in the drawing, the mesas are formed prior to dicing the wafer. This is achieved by providing on the surface of the contact for the outer region 18 individual masking areas of a resist material using standard photolithographic techniques. Each of the masking areas is of a size corresponding to the desired size of the outer region 18. The uncovered portion of the contact is then removed using an etchant suitable for the particular metal or metals of the contact and the uncovered portion of the epitaxial layers are etched with a suitable etchant to form the mesas of the desired contour. The wafer is then diced to form the individual diodes.

The diode 10 can also be made by an epitaxial deposition and diffusion method. For this method one starts with a substrate wafer of the same type as with the previously described method. As in the previously described method, the substrate wafer is mechanically and chemically polished on both surfaces, checked for defects, and a layer of silicon dioxide is coated on one surface thereof. The wafer is then placed in a reactor chamber and a layer of silicon of the desired conductivity type for the third region 22 is epitaxially grown on the other surface of the substrate wafer in the manner previously described. However, the epitaxial layer is grown to a thickness equal to the combined desired thickness of the third region 22 and the outer region 18. The epitaxial layer is then coated with a diffusion source layer of a glassy material containing a high concentration, approximately $10^{21}$ atoms/cm$^3$, of the desired conductivity modifier impurity for the outer region 18. The diffusion source layer may be of silicon dioxide which contains either boron, phosphorus or arsenic. Boron is included for a P+ type outer region 18 and either phosphorus or arsenic is included for N+ type outer region. The diffusion source layer may be deposited on the epitaxial layer in the reactor chamber by pyrolytically reacting a gaseous mixture of silane, oxygen and a material containing the conductivity modifier impurity, such as diborane, phosphine or arsine. The wafer is then heated to a temperature about 1200° C. to diffuse the conductivity modifier impurity from the diffusion source layer into the epitaxial layer. This is carried out for a period of time to diffuse the conductivity modifier impurity into the epitaxial layer to a depth equal to the desired thickness of the outer region 18.

The wafer is then cooled and removed from the reaction chamber. The diffusion source layer is then removed by etching with a suitable etchant. The wafer is then further processed in the same manner as in the previously described method. This includes reducing the thickness of the substrate wafer by lapping, coating the outer regions with metal contacts, etching mesas and dicing.

EXAMPLE

Various diodes of the present invention were made by epitaxially growing on a substrate wafer of low resistance, 0.01 ohm-cm, N+ type silicon a layer of N type silicon and then epitaxially growing on the N type layer a layer of low resistivity, 0.01 ohm-cm, P+ type silicon with an abrupt junction between the N type region and the P+ type region. The N type region was of a thickness and resistance shown in Table II. The diodes diced from the wafers were of a diameter at the P-N junction as indicated in Table II. Table III also shows the electrical characteristics of the various diodes so made.

TABLE II

| | Junction Diameter (microns) | Thickness of N type region (microns | Resistance of N type region (ohm-cm) |
|---|---|---|---|
| 1 | 125 | 2.2 | 1 |
| 2 | 250 | 1.3 | 1 |
| 3 | 125 | 1 | 0.5 |

TABLE III

| | Break-down Voltage (volts) | Bias Current (amps) | Funda-mental Frequency ($GH_z$) | Peak Pulsed Output Power (watts) | Effic-iency (%) |
|---|---|---|---|---|---|
| 1 | 60 | 0.8 | 3.3 | 9 | 30 |
| 2 | 50 | 4.0 | 5 | 11 | 7 |
| 3 | 60 | 1.0 | 8 | 8 | 10 |

I claim:

1. An avalanche diode comprising
a body of semiconductor material having a pair of contiguous regions of opposite conductivity type forming P-N junction therebetween,
one of said regions being of low resistance and the other region being of high resistance,
the high resistance region having a resistance of between 0.5 and 15 ohm-cm and being of a thickness of between 0.5 and 3 microns.

2. An avalanche diode in accordance with claim 1 in which conductivity modifier impurity profile in the high resistance region is such as to form an abrupt or hyperabrupt P-N junction with the low resistance region.

3. An avalanche diode in accordance with claim 2 in which the low resistance region is of a resistance of not greater than about 0.01 ohm-cm and is of a thickness of between 1 and 5 microns.

4. An avalanche diode in accordance with claim 3 including a third region contiguous with the high resistance region and spaced from the low resistance region, said third region being of low resistance and of the same conductivity type as the high resistance region.

5. An avalanche diode in accordance with claim 4 in which the third region is of a resistance not greater than about 0.01 ohm-cm.

* * * * *